(12) United States Patent
Klebanoff et al.

(10) Patent No.: US 6,492,067 B1
(45) Date of Patent: Dec. 10, 2002

(54) REMOVABLE PELLICLE FOR LITHOGRAPHIC MASK PROTECTION AND HANDLING

(75) Inventors: Leonard E. Klebanoff, Dublin, CA (US); Daniel J. Rader, Albuquerque, NM (US); Scott D. Hector, Oakland, CA (US); Khanh B. Nguyen, Sunnyvale, CA (US); Richard H. Stulen, Livermore, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/454,674

(22) Filed: Dec. 3, 1999

(51) Int. Cl.[7] ................................................. G03F 9/00
(52) U.S. Cl. ............................................. 430/5; 428/14
(58) Field of Search ............................. 428/14, 67, 57, 428/76; 430/5

(56) References Cited

U.S. PATENT DOCUMENTS

| | | | |
|---|---|---|---|
| 4,833,051 A | 5/1989 | Imamura | 430/5 |
| 5,061,444 A | 10/1991 | Nazaroff et al. | 422/40 |
| 5,344,677 A | 9/1994 | Hong | 428/14 |
| 6,153,044 A | * 11/2000 | Klebanoff et al. | 156/345 |

* cited by examiner

Primary Examiner—Christopher G. Young
Assistant Examiner—Saleha R. Mohamedolla
(74) Attorney, Agent, or Firm—L. E. Carnahan; T. P. Evans

(57) ABSTRACT

A removable pellicle for a lithographic mask that provides active and robust particle protection, and which utilizes a traditional pellicle and two deployments of thermophoretic protection to keep particles off the mask. The removable pellicle is removably attached via a retaining structure to the mask substrate by magnetic attraction with either contacting or non-contacting magnetic capture mechanisms. The pellicle retaining structural is composed of an anchor piece secured to the mask substrate and a frame member containing a pellicle. The anchor piece and the frame member are in removable contact or non-contact by the magnetic capture or latching mechanism. In one embodiment, the frame member is retained in a floating (non-contact) relation to the anchor piece by magnetic levitation. The frame member and the anchor piece are provided with thermophoretic fins which are interdigitated to prevent particles from reaching the patterned area of the mask. Also, the anchor piece and mask are maintained at a higher temperature than the frame member and pellicle which also prevents particles from reaching the patterned mask area by thermophoresis. The pellicle can be positioned over the mask to provide particle protection during mask handling, inspection, and pumpdown, but which can be removed manually or robotically for lithographic use of the mask.

21 Claims, 5 Drawing Sheets

REMOVABLE PELLICLE FOR LITHOGRAPHIC MASK PROTECTION AND HANDLING

GOVERNMENT RIGHTS

The Government of the United States has rights in this invention pursuant to contract No. DE-AC04-94AL85000 between the United States Department of Energy and the Sandia Corporation for the operation of the Sandia National Laboratories.

BACKGROUND OF THE INVENTION

The present invention is directed to the protection of lithographic masks from particle contamination, particularly to a removable pellicle for lithographic mask protection, and more particularly to a removable pellicle for a lithographic mask utilizing magnetic coupling and thermophoretic protection.

Patterned lithographic masks are utilized in semiconductor chip fabrication, and such lithographic masks need to be protected from particle contamination since foreign matter on a mask will produce a printed defect in the electronic circuit being created on a silicon wafer. For current lithographic manufacture of semiconductor chips, masks are enclosed in a "pellicle" to protect them from particles. The mask consists of a rigid substrate with a patterned absorbing film on one surface. A pellicle is a thin membrane (typically organic-based but can be inorganic-based as well), stretched over a frame mounted to the mask substrate, which prevents particles from striking the patterned areas of the mask. The pellicle is offset from the mask in an "out of focus" image plane, producing a gap between the mask surface (requiring protection) and the pellicle. This offset ensures that particles intercepted by the pellicle do not produce image defects. For the photon wavelengths currently used in chip manufacture (365 nm, 248 nm), the pellicle is highly transparent and allows the lithographic radiation to be transmitted to the mask with high efficiency. Pellicles stay affixed to the mask mounting hardware throughout the life of the mask and allow the mask to be handled and inspected free from defect producing particle contamination.

The next generation of lithographic techniques, 157 nm optical projection lithography, extreme ultraviolet lithography (EUVL), ion projection lithography (IPL), and electron projection lithography (EPL), utilize ionizing radiation (photons, ions and electrons, respectively) to perform lithographic imaging. Thus, the masks used in these next generation lithographic (NGL) techniques are irradiated with ionizing radiation during the lithographic exposure. A traditional pellicle cannot be used with NGL lithography because the pellicle would absorb too much of the ionizing radiation. A membrane might also degrade in the ionizing beam, eventually failing and contaminating the mask. Furthermore, a traditional pellicle would not survive transfer from atmospheric pressure into the vacuum environment ($\sim 10^{-6}$ Torr) needed for the NGL techniques. A sealed pellicle/mask assembly would have a trapped air space, which would burst through the thin membrane when the mask was placed in a vacuum environment.

Since the prior known pellicle is incompatible with NGL techniques only during the lithographic exposure, it is desirable to use a pellicle during the inspection and handling steps of mask manufacture at atmospheric pressure but to remove the pellicle before lithographic exposure. This raises a challenge to remove the pellicle without contaminating the mask with particles created by removal of the pellicle.

The present invention enables removal of a pellicle from an NGL mask without particle contamination of the mask. The removable pellicle of this invention enables its use in storage, handling and loading into NGL apparatus, but removal prior to lithographic exposure of the mask. The removable pellicle of the invention allows handling and inspection of the mask at atmospheric pressure, incorporates thermophoresis to prevent particle contamination, and is vacuum compatible so that it can be inserted into the vacuum environment of NGL exposure tools without bursting the pellicle membrane. After lithographic use, the removable pellicle may be placed back on the mask without particle contamination and transferred again from vacuum to atmospheric pressure without bursting of the pellicle or particle contamination of the mask.

SUMMARY OF THE INVENTION

It is an object of the present invention to provide a removable pellicle for a lithographic mask. A further object of the invention is to provide a lithographic mask pellicle which is removable prior to exposure to ionizing radiation.

A further object of the invention is to provide a removable pellicle for masks utilized in EUV, IP, EP, and 157 nm optical projection lithography.

A further object of the invention is to provide a removable pellicle containing a thin membrane that is usable during the inspection and handling of a lithographic mask at atmospheric pressure but can withstand vacuum applications and is removed before lithographic exposure of the mask.

Another object of the invention is to provide a removable pellicle for a lithographic mask which utilizes mechanical latching or magnetic attraction to removably retain the pellicle over the mask.

Another object of the invention is to provide a removable pellicle for a lithographic mask which utilizes thermophoresis to prevent particles from contaminating the mask.

Other objects and advantages of the present invention will become apparent from the following description and accompanying drawings. The present invention is directed to removable pellicles for lithographic masks. The invention utilizes mechanically latched or magnetically attracted members to retain the pellicle over the mask and which allows the pellicle to be removed from the mask without particle contamination of the mask. This invention enables the use of conventional thin membranes for use as pellicles for masks utilized in lithographic techniques that utilize ionizing radiation (photons, ions, and electrons) such as 157 nm, EUVL, EPL, and IPL. The removable pellicle of the invention is particularly applicable for extreme ultraviolet lithography (EUVL) and can be utilized in storage, handling, and loading into lithographic machines and which is removed prior to lithographic exposure of the mask and replaced following exposure of the mask. The removable pellicle is vacuum compatible and thus can be inserted into the vacuum environment of lithographic tools without bursting the pellicle membrane. Particle protection of the mask is also provided by thermophoresis in combination with a labyrinthine array to prevent particles from contaminating the mask during removal and replacement of the removable pellicle. The magnetic means for retaining the pellicle over the mask may be of a contacting or non-contacting arrangement. Thus, the removable pellicle of this invention utilizes a traditional pellicle and two deployments of thermophoretic protection to keep particles off the masks.

BRIEF DESCRIPTION OF THE DRAWINGS

The accompanying drawings, which are incorporated into and form a part of the disclosure, illustrate embodiments of the invention and together with the description, serve to explain the principles of the invention.

DETAILED DESCRIPTION OF THE INVENTION

The present invention is directed to removable pellicles for lithographic masks used in next-generation lithography employing ionizing radiation (photons, ions and electrons) to perform lithographic imaging. The masks used in lithographic techniques such as EUVL, IPL, and EPL (NGL lithography) are irradiated with ionizing radiation during the lithographic exposure and as pointed out above, the prior known pellicle cannot be used with NGL lithography because the pellicle would absorb too much of the ionizing radiation. Further, as pointed out above, the prior known pellicle would not survive transfer from atmospheric pressure into the vacuum environment (~$10^{-6}$ Torr) needed for the NGL technologies. A sealed pellicle/mask assembly would have a trapped air space which would burst through the thin (~0.5–3.0 $\mu$m) membrane, when the mask is placed in a vacuum environment. Since the prior art pellicle is incompatible with NGL techniques only during the lithographic exposure, it is desirable to use a pellicle during the inspection and handling steps of mask manufacture at atmospheric pressure, but to remove the pellicle before lithographic exposure without contaminating the mask with particles generated by removal of the pellicle. The present invention provides a removable pellicle that is removed from the mask such that the mask is fully protected from particles created by the mechanical removal of the pellicle. After lithographic use, the removable pellicle may be placed back on the mask without particle contamination and the mask transferred from vacuum to atmospheric pressure without bursting of the pellicle or particle contamination of the mask. Thus, the removable pellicle of this invention allows the mask to be handled and inspected at atmospheric pressure with the pellicle in place, thereby providing particle protection of the mask. The invention provides particle protection greater than that provided by the prior known pellicles by incorporating thermophoresis which provides added particle protection. The removable mask is vacuum compatible because it can be inserted into the vacuum environment of the NGL exposure tools without bursting the pellicle membrane. Accordingly, the removable pellicle of this invention combines low particle-generating mechanical features with thermophoretic protection to provide a particle-free environment for mask handling, inspection, pumpdown, and lithographic use. The removable pellicle can be made similar in appearance with the prior known pellicles and rests on a frame surrounding the patterned area of the mask.

While the removable pellicle of the present invention is described hereinafter for EUVL applications, it can be utilized in EPL and IPL applications and 157 nm optical lithography uses, except that a removable pellicle would be required on both sides of the mask.

Figure 1:
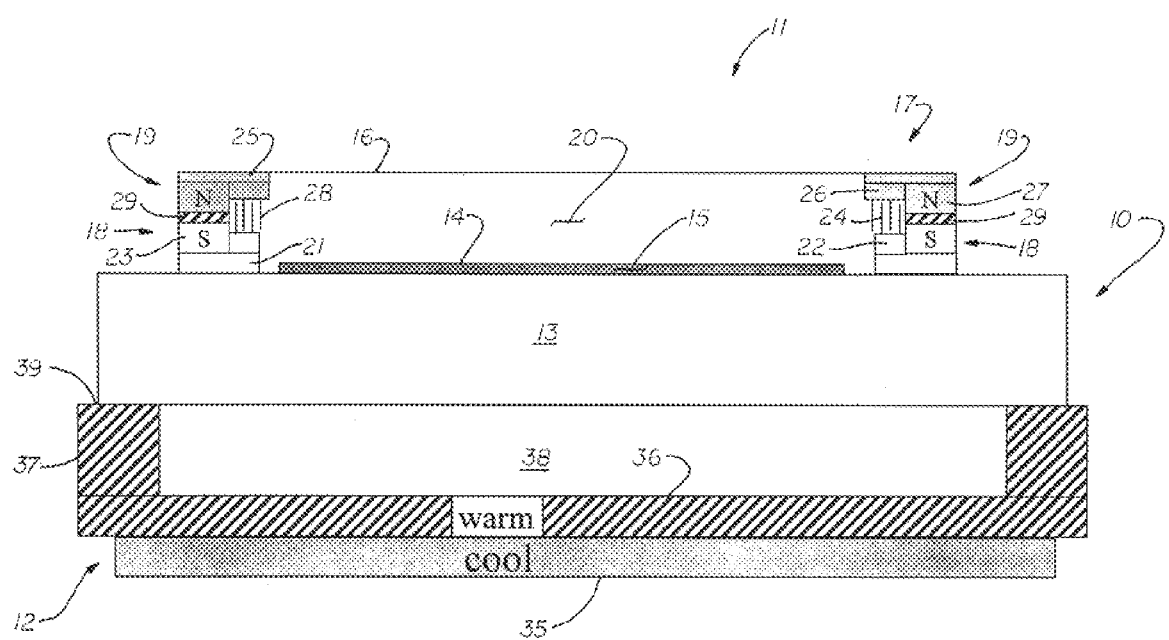
FIG. 1 illustrates a cross-sectioned view of an embodiment of a removable pellicle for a patterned mask made in accordance with the present invention and includes means for producing thermophoretic protection of the mask.
Figure 2:
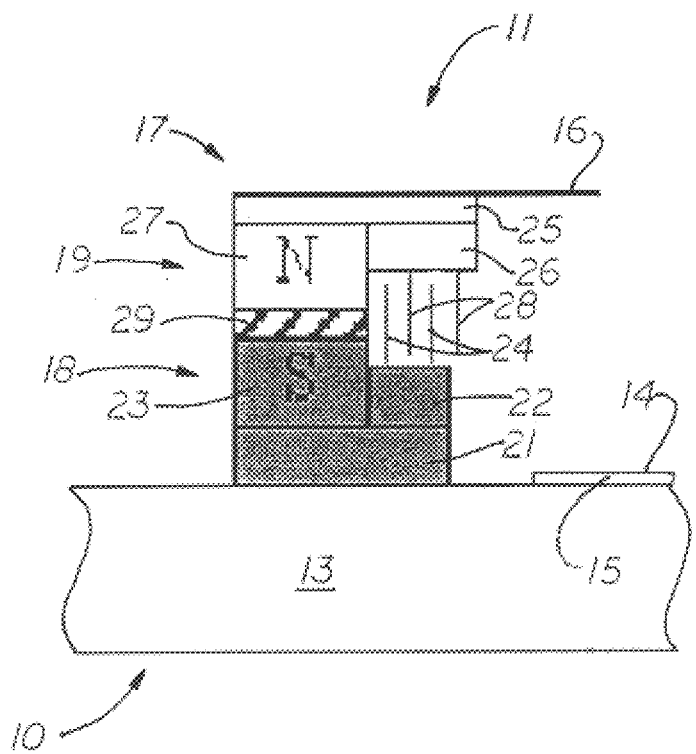
FIG. 2 is an enlarged illustration of the magnetic latching mechanism and thermophoretic barrier of FIG. 1.
Figure 3:
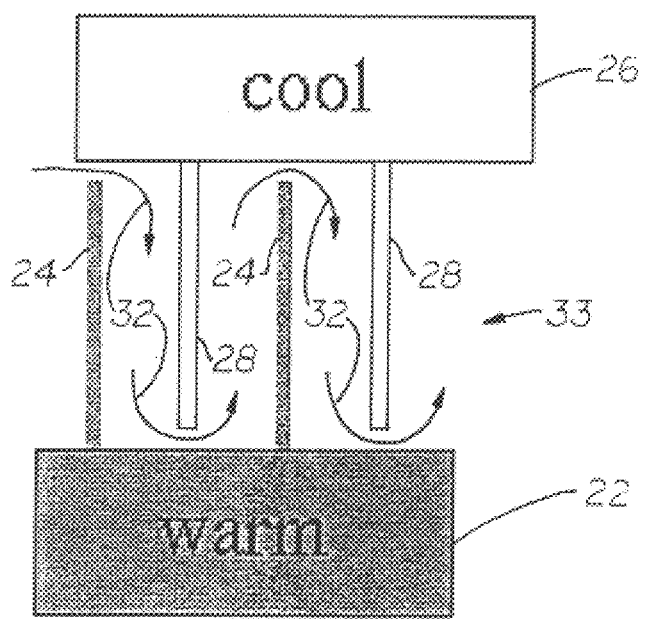
FIG. 3 is a partial enlargement of the retaining arrangement of FIG. 2 illustrating the thermophoretic fins of the FIG. 1 embodiment.
Figure 5:
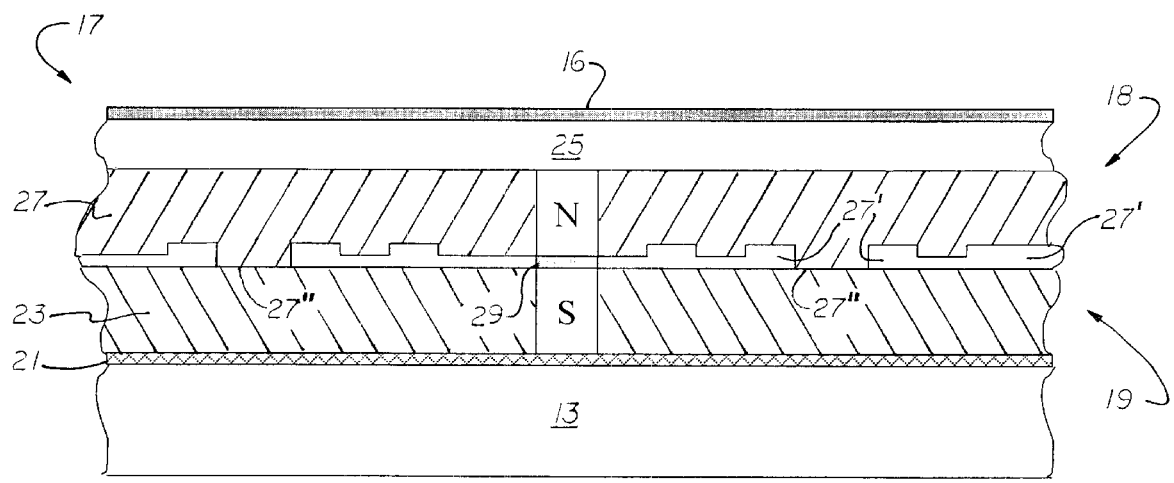
FIG. 5 is a partial cutaway section of a side view of the mask and the removable pellicle of FIG. 2.

FIG. 1 illustrates in cross-section an embodiment of a removable pellicle for EUVL applications. As shown, the mask is generally indicated at 10, the removable pellicle generally indicated at 11 with the mask 10 positioned on a heating mechanism generally indicated at 12. FIG. 2 is a partial enlargement of a magnetic capture or latching mechanism of the FIG. 1 removable pellicle 11 and FIG. 3 is a further enlargement of a section of the capture mechanism of FIG. 2 illustrating the thermophoresis fins of the removable pellicle 11, with FIG. 5 showing a partial side view of FIGS. 1 and 3. The mask 10 consists of a substrate 13 composed, for example, of a low thermal expansion material (LTEM), which is provided with a thin multilayer film (not shown) in a mask patterned area 15 deposited on a top surface of substrate 13. A mask patterned surface area 14 is written and transferred into an absorbing film on the multilayer within an LTEM patterned mask area 15, as shown in FIG. 1. (Details of the pattern are not shown in FIG. 1.)

The removable pellicle 11 includes a thin (~0.5–3.0 $\mu$m thick) organic-based or inorganic-based pellicle membrane 16 (hereinafter "pellicle"), mounted to a hardware assembly generally indicated at 17 which is attached to the mask substrate 13 with a suitable adhesive of good thermal conductivity such as TRA-CON 2151™ that does not outgas contaminating species. The pellicle mounting hardware assembly 17 could be made of any material, with the preferred embodiment being a metal with good thermal conductivity such as copper or aluminum. The pellicle 16 can be made of any material which allows for optical inspection of the mask, such as perfluorocarbon or nitrocellulose.

Figure 4:
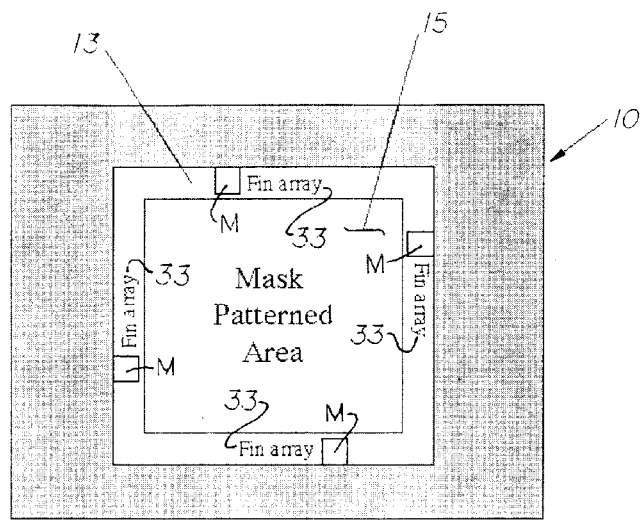
FIG. 4 is a top view of the embodiment of FIG. 1 illustrating the location of the thermophoretic fin array about the patterned area of the mask.

The pellicle mounting hardware assembly 17 basically comprises two sections, an anchor piece or section 18 secured to the mask substrate 13 and pellicle holder piece or section 19 to which pellicle 16 is mounted. The mask 10 and removable pellicle 11 and heating mechanism 12 are, in this embodiment, of a rectangular configuration as seen in FIG. 4 but may be of an annular or other configuration. The mounting hardware assembly 17 is mounted to pellicle 16 and mask substrate 13 so as to form a gap 20 between the mask surface 14 and pellicle 16. As seen more clearly in FIGS. 2 and 5, the anchor piece 18 is composed of rectangular shaped members 21, 22, and 23, with member 21 being secured to mask substrate 13. Member 22 is provided with a plurality of protruding fins or members 24, for purposes described hereinafter with respect to FIG. 3, and member 23 includes four (4) magnetic south (S) pole pieces, one in each of the four sides of rectangular member 23 as indicated by the permanent magnets M in FIG. 4. The pellicle holder piece 19 is composed of rectangular shaped members 25, 26 and 27 with member 25 being secured to pellicle 16. Member 26 is provided with a plurality of protruding fins or members 28, which are interdigitated with fins 24 of member 22 of anchor piece 18 and member 27 includes four (4) magnetic north (N) pole pieces, one in each of the four sides of rectangular member 27, as indicated by the permanent magnets M in FIG. 4. It is thus seen that the pellicle holder piece 19 is magnetically latched to the anchor piece 18 via the magnetic attraction of magnetic pole pieces N and S. Note that the anchor piece 18 is fixed to substrate 13 outside the sensitive patterned area 15.

Those skilled in the art will recognize that creating and deploying a structure comprising a single magnetic pole is, of course, not possible. However, only the one functional pole of each magnet M necessary for operation of the invention has been depicted. The unused, opposite pole of each magnet M is assumed to be terminate, as with a iron strip or cap, and not shown as part of the drawings. This was done for the sake of brevity and clarity of illustration.

Any permanent magnetic material may be utilized for the pole pieces S and N. Electromagnets may be used as an alternative to permanent magnets. Magnetic attraction using permanent magnets is preferred for the attachment of anchor piece 18 and holder piece 19 because power is not required and magnetic fields are not a potent source of particle deposition. However, any mechanical latching mechanism may be used since the removable pellicle of the illustrated embodiment defends the mask against particles created during latching and unlatching of holder piece 19 to anchor piece 18.

There can be any number of magnetic latches (magnets M) but four magnetic points of contact are preferred as indicated in FIG. 4, the location of the magnets M may be anywhere along the four sides of the rectangular mounting hardware assembly 17 and may, for example, be located in the center of each of the four sides. Each pole piece (N, S) of a magnetic latch M is coated with a thin layer of low particle-generating material 29, shown greatly enlarged in FIGS. 1, 2 and 5 so that when the holder piece 19 is pulled away from anchor piece 18 (thereby opening the pellicle), there is a minimal number of particles created at the contact point. The low particle-generating material 29 could be DELRIN™, VESPEL™, or TEFLON™ or other low particle-generating material, and the thickness of layer 29 could be any thickness above several microns. The magnetic latches M (poles N, S) may be shaped so that they act as "kinematic mounts" allowing a precise, repeatable "self-fitting" orientation of holder piece 19 to anchor piece 18. The magnetic pole pieces provide a strong enough attraction so that piece 19 is securely attached to piece 18 (even in upside-down orientation), but not so strong that a robotic system could not remove holder piece 19 from anchor piece 18. Hardware allowing robotic removal of upper piece 19 is not shown, but could consist of many possible geometries and designs. For EUVL lithography, a rectangular photomask patterned area is utilized as shown at 15 in FIG. 4. The mask substrate 13 and anchor piece 18 are preferably at a higher temperature than the pellicle 16 and holder piece 19 for thermophoretic particle protection of the surface 14 of mask patterned area 15, as described in greater detail hereinafter. Similarly, the preferred shape of the removable pellicle 11 for EUV use is rectangular as shown in FIG. 4, but the mask 10 and removable pellicle 11 may be of other configuration. The edges of holder piece 19 along the rectangular shape of contact (in the plane perpendicular to that of FIG. 1, parallel to FIG. 4) is recessed in places to allow for increased gas flow underneath the boundary where pieces 18 and 19 meet, as shown in FIG. 5. Member 27 is provided with spaced grooves or recesses 27' which can be designed to allow for increased gas flow in and out of the gap area 20 (not shown in FIG. 5) below the pellicle 16 during pump-out and venting operations. Extended regions of recessed or grooved areas minimize the thermal conduction between pieces 18 and 19 (needed for thermophoretic protection), while minimizing mechanical contact associated with pellicle removal (thereby minimizing particle generation). By way of example, spaced grooves or recesses 27' may have a depth of about 1 mm to about 10 mm and a width of about 5 mm to about 30 mm.

It is desirable that anchor piece 18 and holder piece 19 be in electrical contact to eliminate electric fields that are potent sources of particle deposition. If the layer 29 is not electrically conductive to allow electrical contact between these pieces, then electrical contact should be made in a way that maintains minimal thermal contact between the pieces 18 and 19 so as to allow piece 18 to be warmer than piece 19 when thermophoresis is activated. To establish electrical contact between pieces 18 and 19, pieces 23 and 27 are designed to have a plurality of contact points 27" as shown in FIG. 5. These contact points can be 5 mm to 20 mm in length and be of any number which will achieve a stable configuration, for example 3. Furthermore, those skilled in the art will recognize that there are many possible configurations of contacts which will achieve the desired effect of electrical continuity between pieces 18 and 19.

Figure 6:
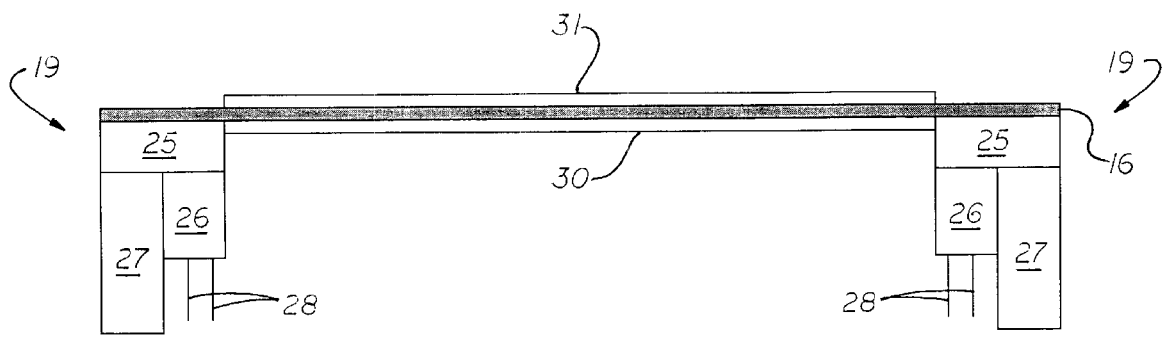
FIG. 6 illustrates a cross-sectioned view of a removable pellicle which is similar to FIG. 1 with conductive films on each side of the pellicle.

It would be desirable to have a pellicle 16 that is electrically conducting on one or both surfaces so as to neutralize electric fields in the gap area 20. If the pellicle material itself is not electrically conducting, then satisfactory conductivity can be achieved by applying a very thin (~10 Å to ~500 Å) coating of a conductive material on to one or both sides of the pellicle 16 to achieve electrical control at the pellicle while maintaining high optical transmission through the pellicle for mask inspection purposes. FIG. 6 illustrates an embodiment of the pellicle and holder piece of FIG. 1 with a conductive coating on both sides of the pellicle in the area of the pellicle above the patterned mask area 15, and corresponding components are given corresponding reference numbers. As shown, the pellicle 16, secured to rectangular member 25 of holder piece 19, is provided with thin layers 30 and 31 of any electrically conductive material having a thickness of ~10 Å to ~500 Å. Materials such as carbon, or any of the noble or transition metals are useful in this regard so long as the coating is rendered in an adherent layer which is not prone to particle formation and which has low enough stress to not decrease the fracture strength of the pellicle membrane 16.

Even though the magnetic latches M (pole pieces N, S) are coated with a low particle material 29, when holder piece 19 is pulled away from anchor piece 18 there will inevitably be particles created at the four break points M shown in FIG. 4. These particles must be kept from reaching the patterned mask area 15. The magnetic break points M are located at the periphery of the pellicle so that a protective region can be created between the source of particles (the magnetic latches) and the mask area 15. FIG. 3 shows an enlarged expanded view of members 22 and 26 having protruding fins 24 and 28, which are located adjacent to the magnetic pole pieces S and N (magnetic latch M). The fins 24 and 28 are interdigitated so that a tortuous path is formed from the periphery of the removable pellicle 11 towards the patterned mask area 15, as indicated by arrows 32. Thus, a particle created at the magnetic latch (pole pieces N, S), or anywhere outside the removable pellicle 11, must snake in and around the labyrinthine array of fins 24 and 28, generally indicated at 33, in order to reach the mask area 15. The fins extend entirely around the outside perimeter of the patterned mask area 15, as indicated at 33 in FIG. 4.

To further enhance the particle protection, the entire removable pellicle holder 11 incorporates thermophoretic protection both at the mask and within the array of fins 33 to provide particle protection for the patterned mask area 15. To emphasize the thermophoretic operation, the array of fins 33 (fins 24 and 28) will be referred to as "thermophoretic fins."

Figure 7:
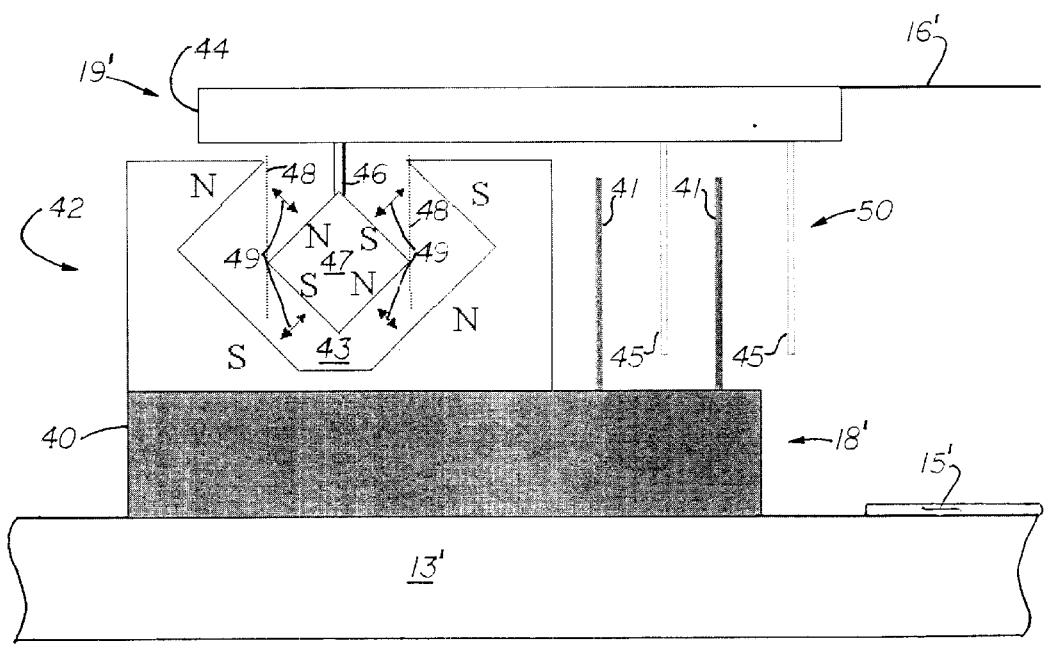
FIG. 7 is a cross-sectioned view of another embodiment of the removable pellicle utilizing magnetic levitation to create a contact-free capture mechanism.

Thermophoresis is the phenomenon in which particles residing in a gas supporting a temperature gradient are driven away from warm surfaces toward cooler surfaces. Thermophoresis can counteract particle contamination by diffusive, electrostatic or gravitational deposition. Nazaroff, et. al., J. Aerosol Sci, 18 (4), 445 (1987), analyzed the thermophoretic phenomenon at atmospheric pressure and showed that significant reductions in particle deposition can be gained by heating vertical surfaces (requiring protection) relative to their surroundings. The removable pellicle 11 exploits thermophoresis not only at atmospheric pressure, but also at sub-atmospheric pressure. The removable pellicle 11 utilizes thermophoretic protection both at the patterned mask area itself and in the thermophoretic fins 33 to prevent particle deposition at the mask. Any orientation of the pellicle/mask assembly may be used. However, to aid in particle protection, the preferred orientation of the mask/pellicle assembly (10/11) is "face-down" so that gravity augments thermophoresis in driving particles away from the mask patterned area 15.

To enable thermophoretic protection, the mask 10 and lower fins 24 attached to anchor piece 18 must be heated to a temperature greater than the holder piece 19 and the fins 28. As shown, the mask/pellicle assembly (10/11) rests in storage on a heating mechanism 12 of FIG. 1, which comprises in this embodiment a "thermoelectric heater" which is warm on one side and cool on the other side. As shown, heater 12 includes a cool plate or member 35 and a warm plate or member 36 with a warm flange or hollow member 37 secured to the periphery of plate 36 so as to define a space 38. The substrate 13 of mask 10 rests on an upper surface 39 of flange 37 and is heated thereby. However, other types of heating devices and geometries may be used. The warm side (plate 36 and flange 37) of the thermoelectric heater 12 warms the mask/pellicle anchor assembly 10/18. In FIG. 1 the warm surface 39 touches the edges of the mask substrate 13 so as not to introduce (by contact) particles on the back side of the mask 10 underneath the mask patterned area 15. At atmospheric pressure there would be sufficient convective heat transfer from the warm surface 39 to the mask 10 to provide heating in the mask patterned area 15. By way of example, the cool plate 35 may be at a temperature of about 10° C. to about 25° C. and the warm plate 36 and flange 37 may be at a temperature of about 30° C. to about 70° C.

As the mask 10 heats up, so do the lower members 21, 22, and 23 of anchor piece 18. By designing for poor thermal contact between anchor piece 18 and holder piece 19, the anchor piece 18 will always be warmer than the holder piece 19. With the proper orientation of the temperature gradient between pieces 18 and 19 established, a particle in the gap 20 between the pellicle 16 and the patterned mask area 15 will be pushed away from the mask by the thermophoretic force. A temperature gradient of about 1° C./cm to about 100° C./cm may be established between pieces 18 and 19. As shown more clearly in FIGS. 2 and 3, the thermophoretic fins 33 (fins 24 and 28) are constructed and arranged such that the lower fins 24 of member 22 of anchor piece 18 are warm, whereas the fins 28 of member 26 of holder piece 19 are relatively cooler. The temperature gradient between the fins 24–28 provides a thermophoretic barrier for particles entering the labyrinthine fin area 33. By way of example, the temperature gradient between fins 24 and 28 may be about 1° C./cm to about 100° C./cm. Particles outside the removable pellicle 11 entering the fins 33 from the periphery or particles generated at the material 29 (between pole pieces N-S) when the magnetic seal is broken, must traverse the thermophoretic fins 33 to reach the patterned mask area 15. Upon entering the thermophoretic fins 33, particles will be pushed away from the warm fins 24 and toward the cooler fins 28 where they will deposit. Therefore, by virtue of thermophoresis, particles entering the pellicle cannot reach the patterned mask area 15 of mask 10.

When the mask/pellicle assembly (10/11) is removed from the storage area containing the thermoelectric heater 12, the mask 10 and anchor piece 18 will tend to stay warm, since LTEM, of which mask 10 is composed, has a high heat capacity. Thermal modeling has indicated the heat retention will allow thermophoretic protection to remain in effect after removal from the heat mechanism 12 for up to about 10 to 20 minutes, more than enough time to effect transfer of the mask from heater to the lithographic exposure stage. The preferred mode of mask storage, transport, and use is with the mask "face down"so that gravity augments thermophoresis in particle protection. When the mask/pellicle assembly (10/11) is loaded into the lithographic tool, the removable pellicle can be pumped out via the recessed areas or spaced grooves or recesses 27' of FIG. 5 along the boundary between pieces 18 and 19. During evacuation, the gas flow will be from inside the pellicle holder 11 out towards the peripheral regions of the pellicle holder. This gas flow will also help sweep out of the pellicle holder particles that may be in the fin array 33.

It is anticipated that the pellicle holder piece 19 will be robotically removed from the anchor piece 18. The robot arm should be electrically grounded to the rest of the lithographic machine. When the robot arm touches the pellicle holder piece 19, it will establish electrical connection between the lithographic machine, the holder piece 19 and anchor piece 18, thereby eliminating any electric fields that might act to deposit particles on the mask when the pellicle is removed.

When the holder piece 19 is removed, the patterned mask area 15 is somewhat warmer than its surroundings. Therefore, thermophoresis will be the sole source of particle protection once the pellicle 16 is removed. The mask 10 can then be loaded onto the mask stage in the stepper of the lithographic machine where it can be heated further by a heated mask chuck or allowed to heat up under exposure to EUV radiation. Thermal modeling of EUV lithography indicates that a LTEM mask will heat up tens of degrees during lithographic use, thereby providing a convenient source of heating for thermophoresis.

When the mask 10 is to be removed from the stepper, it will be warm from lithographic exposure or from the mask chuck. One simply reverses the process discussed above to robotically reassemble holder piece 19 to anchor piece 18, vent the mask/pellicle assembly (10/11), and remove the assembly from the stepper. The thermophoretic fins 33 will be especially important during the pellicle vent cycle, since gas flow will be from the pellicle holder piece periphery in towards the patterned mask area 15. Particles entrained in the vent flow must be removed by thermophoresis before the gas reaches the mask area 15.

FIG. 7 illustrates an alternative embodiment for the magnetic capture or latching mechanism that is totally non-contacting, allowing the pellicle holder to be removed and replaced on the mask without breaking any mechanical contacts. Therefore, the particle threat to the mask could be minimized even further. FIG. 7 shows an expanded cross-sectional view of the seal area for the non-contacting embodiment, in analogy to the expanded view shown in FIG. 2. As shown, a mask 10' having a peripheral edge 13' and a patterned area 15' is covered by a pellicle 16' mounted to a holder piece 19' which is magnetically retained by an anchor piece 18' secured to the peripheral area 13' of mask 10'. Anchor piece 18' includes a rectangular member 40 attached as by adhesive, etc., to mask 10' and includes a plurality of protruding fins 41. Secured to member 40 is an array of permanent magnets, generally indicated at 42 with magnetic poles N and S as shown and having an opening 43 therein. The holder piece 19' includes a rectangular member 44 secured to pellicle 16' and is provided with a plurality of protruding fins 45. Attached to member 44 by an arm 46 is an array 47 of permanent magnets with their magnetic poles N and S oriented as shown in FIG. 7, the magnet array 47 being located in the opening 43 of magnet array 42. The magnetic poles N and S of array 42 are oriented in opposition (repulsion) with respect to the poles N and S of array 47. The dash lines 48 beside the array 47 show that the holder piece 19' can be lifted from the anchor piece 18' without mechanical contact or interference. As shown, the holder piece 19' is magnetically levitated above the anchor piece 18' and as in the FIGS. 1–6 embodiment, the holder piece 19' is at a cooler temperature than the anchor piece 18' and mask 10'. The permanent magnet arrays 42 and 47 can extend entirely around the perimeter of the mask patterned area 15' or consist of discrete stations for magnetic levitation. Where discrete magnetic levitation stations are used, the areas between the stations would be composed of members having fins connected to anchor piece 18' and holder piece 19' to fill the gap between members 40 and 44, similar to members 23 and 27 of FIGS. 5 and 6 which would be constructed to include recessed border areas such as spaced grooves or recesses 27' for gas flow as described above.

The doubled-headed arrows 49 in FIG. 7 indicate magnetic repulsive interactions that result if the array 47 is displaced from its stable equilibrium point of levitation in opening 43 of magnet array 42. Since displacement of holder piece 19' (and therefore array 47) relative to anchor piece 18' (and array 42) produces repulsive interactions 49 that act to restore the original position, holder piece 19' floats above anchor piece 18' in a stabilized equilibrium position. The combined assemblies 18' and 19' when formed along the rectangular perimeter of the removable pellicle as shown in FIG. 4, constitutes a magnetic suspension system that constrains the relative motion of holder piece 19' to anchor piece 18' along three axes. The tapered shapes of the magnetic arrays 42 and 47 provide the three axis stabilization. As shown in FIG. 7, the upper repulsive interactions between arrays 42 and 47 (shown by the upper doubled-headed arrows 49) is a barrier to pellicle removal. The lower repulsive interactions between arrays 42 and 47 (shown by the lower double-headed arrows 49) prevents the holder piece 19' from contacting the anchor piece 18'. Since the holder piece 19' can be made very light, the permanent magnets of arrays 42 and 47 need not be very large or strongly magnetic. The strengths of the permanent magnets can therefore be chosen to provide stabilization of the relatively light holder piece 19' without being so strong that a robot could not remove the holder piece 19'. In this way, the magnetic levitation system of FIG. 7 provides a barrier to pellicle removal (to prevent accidental removal), but a surmountable barrier so that the pellicle can be removed when desired.

Since the levitation system of FIG. 7 is based on magnetic suspension, there are no mechanical contact points. Therefore, no particles are created at the periphery of the fin array indicated at 50 (fins 41 and 45) when the holder piece 19' is removed. Although the thermophoretic fin array 50 is designed to protect against such particles, it may be desirable to use the alternative non-contacting magnetic latch of FIG. 7 to keep such particles from being generated.

The fin array 50 (fins 41 and 45) of FIG. 7, like fin array 33 of FIGS. 2 and 3, has an alternating warm-cool pattern, with fins 41 being warmer than fins 45. This pattern thermophoretically drives particles radially in (towards the right as shown) or radially out (towards the left as shown), but always driving particles toward a cooler fin wall, where the particles deposit. One could construct the fin array to provide a gradual decrease in temperatures with radial distance from the patterned mask area. In this way, the thermophoretic force between neighboring fins is always directed away from the patterned mask area and out towards the removable pellicle periphery. This would provide a somewhat increased particle protection since the thermophoretic force is always directed away from the patterned mask areas.

It is to be noted that for EPL and IPL applications (and possibly for 157 nm optical lithography) a transmission mask will be used which requires "pellicalization" of both sides of the mask. The removable pellicle of either the FIGS. 1–6 or FIG. 7 embodiments may be positioned on each side of the mask. Both removable holder pieces of sections 19 or 19' on each side of the 157 nm, EPL or IPL mask would have to be removed prior to exposure of the mask to the ionizing radiation.

As seen in the preceding description, therefore, the general approach of the instant invention is quite flexible, allowing deployment in a wide variety of geometries and embodiments. For example in many situations involving lithographic applications, it will be necessary to gain full access to the entirety of the top surface of mask substrate 13, both within the mask patterned area 15 of FIG. 1 and outside of it. Typically, this is required when bringing focusing, leveling, and interferometry hardware over the entire front surface of the mask, prior to, during, and after lithographic exposure.

Figure 8:
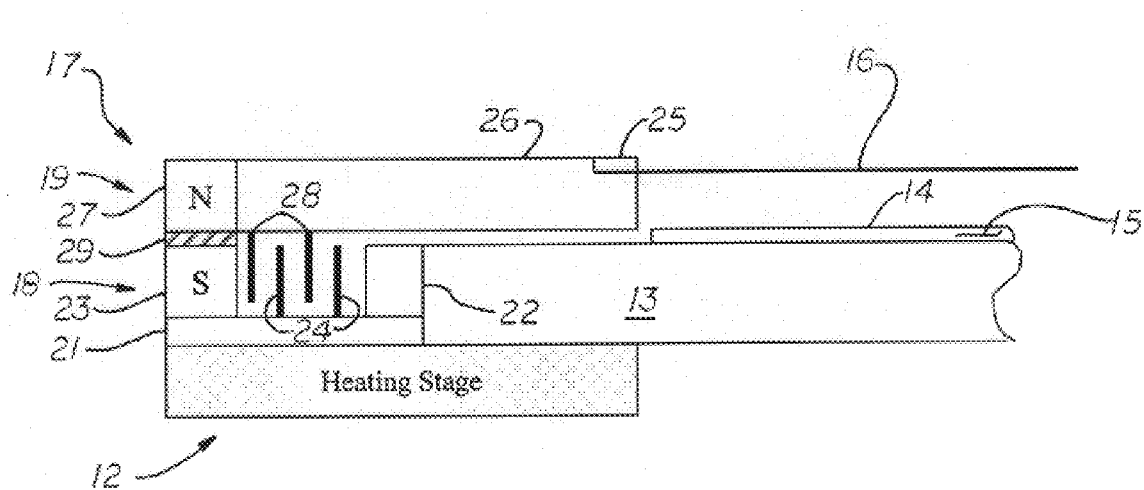
FIG. 8 is a cross-sectioned view of another embodiment of the removable pellicle wherein the thermophoretic fins of the FIG. 1 embodiment are recessed so as to allow full access to the front face of a mask after pellicle removal.

This requirement is provided for in another embodiment, shown in FIG. 8, wherein the anchor piece 18 of FIG. 1 and its thermophoretic fin structures 24 are assembled around mask substrate 13 so that it is flush, or nearly flush, to mask surface 14. Pellicle holder piece 19 to which pellicle 16 is mounted is constructed so as to rest on the top surface of anchor piece 18 in such a way that its thermophoretic fin structures 28 extend interdigitally between recessed fins 24.

As can be seen in FIG. 8, once holder piece 19 is removed from anchor piece 18, piece 18 is flush with mask surface 14 of the mask substrate 13. This, in turn, allows full access to the front surface of the mask, important in those cases where instrumentation must be brought into close proximity with surface 14, such as within several millimeters to within several microns above said surface. The embodiment of FIG. 8 allows for this front surface access.

Finally, as can be seen in FIG. 8, a particle originating at the periphery of the pellicle must circumvent two thermophoretic barriers. The first barrier consists of a labyrinthine array formed by the fin structures 24 and 28. The second thermophoretic barrier is formed between the warm front surface of the mask LTEM substrate 13 and the cooler pellicle holder piece 19. Should a particle surmount the first barrier, it must also traverse the substantial distance and thermophoretic potential presented by the second barrier before reaching mask patterned area 15.

It has thus been shown that the removable pellicle of this invention provides active and robust particle protection for masks. The removable pellicle utilizes a traditional (well known, organic-based or inorganic-based) pellicle and two deployments of thermophoretic protection (at the mask and in the fin area) to keep particles off the mask. The removable pellicle may be effectively utilized in lithography storage, handling, and inspection. The mask/pellicle assembly (10/11) can be loaded into the lithographic machine, after which the pellicle holder piece 19 can be removed for lithographic exposure of the mask 10, and then replaced following lithographic exposure.

While embodiments of the removable pellicle, along with materials, parameters, etc., have been described and/or illustrated to exemplify and teach the principles of the invention, such are not intended to be limiting. Modifications and changes may become apparent to those skilled in the art, and it is intended that the invention be limited only by the scope of the appended claims.

What is claimed is:

1. A removable pellicle for lithographic masks, comprising:
   a first assembly adapted to be secured to a lithographic mask; and
   a second assembly removably mounted to said first assembly, said second assembly including a pellicle membrane, said first and second assemblies including thermophoretic particle protection means comprising a plurality of protruding fins mounted to said first assembly and to said second assembly, said fins being positioned with respect to each other to provide a labyrinthine path therethrough when said second assemblies are mounted to said first assembly.

2. The removable pellicle of claim 1, wherein said mask includes a patterned area and said first assembly and said second assembly are constructed to extend around said patterned area of said mask and wherein said protruding fins are located adjacent to said patterned area of said mask.

3. The removable pellicle of claim 1, wherein said thermophoretic particle protection means further includes means for heating said first assembly without substantial increase in temperature of said second assembly, such that particles generated by removal of or replacement of said second assembly are collected by the second assembly due to thermophoresis.

4. The removable pellicle of claim 3, wherein said means for heating said first assembly also heats said mask and wherein said first and second assemblies each include a plurality of protruding fins, said fins being interdigitated when said second assembly,is mounted onto said first assembly producing thereby a labyrinthine path therethrough, said fins on said first assembly being heated by said heating means to a temperature higher than a temperature of said fins on said second assembly thereby creating a thermophoretic effect along said labyrinthine path such that, particles passing therebetween are collected by said fins on said second assembly due to thermophoresis, and thereby protecting a patterned area of said mask, at atmosphere pressure and at sub-atmosphere pressure, from particles generated outside the first and second assemblies or generated when said second assembly is removed from said first assembly or when said second assembly is replaced on said first assembly.

5. A removable pellicle for protecting a patterned area of a lithographic mask from particles, comprising:

an anchor piece secured to said mask and about the periphery of said patterned area;
a holder piece to which is mounted a pellicle membrane, said anchor piece and said holder piece including thermophoretic particle protection means comprising a plurality of protruding fins mounted to said holder piece and to said anchor piece, said fins being positioned with respect to each other to provide a labyrinthine path therethrough when said holder piece are mounted to said anchor piece of said patterned area; and
latching means for removably retaining said holder piece with respect to said anchor piece.

6. The removable pellicle of claim 5, wherein said latching means comprises a plurality of magnetic latches positioned in spaced relation about said anchor piece and said holder piece.

7. The removable pellicle of claim 6, wherein said plurality of magnetic latches consists of sets of magnetic north and south poles, each set of said north and south poles being mounted to said anchor piece and said holder piece.

8. The removable pellicle of claim 5, wherein said latching means comprises an array of magnets mounted to said anchor piece and an array of magnets mounted to said holder piece such that said holder piece is magnetically levitated above said anchor piece.

9. The removable pellicle of claim 5, wherein said means for producing thermophoretic particle protection of said patterned area comprises an array of interdigitated fins on said anchor piece and said holder piece.

10. The removable pellicle of claim 5, wherein said means for producing thermophoretic particle protection of said patterned area comprises means for maintaining said mask and said anchor piece at a temperature higher than said holder piece and said pellicle membrane.

11. The removable pellicle of claim 7, wherein the anchor piece is about flush to below flush with a top surface of said patterned area such that when said pellicle is removed said top surface is accessible to inspection and process instrumentation which require approaching said top surface to within about less than 10 microns.

12. The removable pellicle of claim 11, wherein said lithographic mask further comprises a mask substrate and wherein said holder piece comprises an elongated member extending over said substrate up to said patterned area, said elongated member and said substrate separated from each other by a fixed distance, said distance controlled by a low particle generating material layer placed between said anchor and said holder pieces, said elongated member and said substrate forming a thermophoretic barrier when a thermal gradient is created therebetween.

13. The removable pellicle of claim 1, wherein said second assembly is removably mounted to said first assembly by a latching mechanism.

14. The removable pellicle of claim 13, wherein said latching mechanism is of a magnetic type.

15. The removable pellicle of claim 14, wherein said magnetic type latching mechanism comprises magnetic attraction of north and south magnetic pole pieces mounted to said first and second assemblies.

16. The removable pellicle of claim 15, wherein said first and second assemblies are of a rectangular configuration and wherein at least one pair of north and south magnetic pole pieces are positioned in each of four sides of the assemblies.

17. The removable pellicle of claim 14, wherein said magnetic type latching mechanism comprises an array of magnets mounted to each of said first and second assemblies such that said second assembly is magnetically levitated above said first assembly.

18. The removable pellicle of claim 17, wherein said array of magnets mounted to said first assembly is configured to include an opening therein and wherein said array of magnets mounted to said second assembly is located within said opening in said array of magnets mounted to said first assembly.

19. The removable pellicle of claim 18, wherein said arrays of magnets are mounted with their magnetic poles oriented in opposition to each other.

20. The removable pellicle of claim 19, wherein said magnetic poles of each array of magnets are located along tapered surfaces to provide a three-axis stabilization of said second assembly with respect to said first assembly.

21. The removable pellicle of claim 13, wherein said latching mechanism is constructed to create substantially no particles when said second assembly is removed from or placed on said first assembly.

* * * * *